(12) United States Patent
Taylor et al.

(10) Patent No.: US 10,026,708 B2
(45) Date of Patent: Jul. 17, 2018

(54) STRONG, HEAT STABLE JUNCTION

(71) Applicant: U.S. Army Research Laboratory ATTN: RDRL-LOC-I, Adelphi, MD (US)

(72) Inventors: Patrick J Taylor, Vienna, VA (US); Sudhir Trivedi, Nottingham, MD (US); Wendy L Sarney, Columbia, MD (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 629 days.

(21) Appl. No.: 13/657,957

(22) Filed: Oct. 23, 2012

(65) Prior Publication Data

US 2014/0110848 A1  Apr. 24, 2014

(51) Int. Cl.
*H01L 23/48* (2006.01)
*H01L 23/00* (2006.01)

(52) U.S. Cl.
CPC ............... *H01L 24/29* (2013.01); *H01L 24/32* (2013.01); *H01L 24/83* (2013.01); *H01L 24/03* (2013.01); *H01L 24/05* (2013.01); *H01L 24/27* (2013.01); *H01L 2224/0345* (2013.01); *H01L 2224/0381* (2013.01); *H01L 2224/03462* (2013.01); *H01L 2224/03464* (2013.01); *H01L 2224/03828* (2013.01); *H01L 2224/04026* (2013.01); *H01L 2224/05655* (2013.01); *H01L 2224/2745* (2013.01); *H01L 2224/27462* (2013.01); *H01L 2224/27464* (2013.01); *H01L 2224/29109* (2013.01); *H01L 2224/29111* (2013.01); *H01L 2224/29144* (2013.01); *H01L 2224/29155* (2013.01); *H01L 2224/32503* (2013.01); *H01L 2224/32507* (2013.01); *H01L 2224/8309* (2013.01); *H01L 2224/83011* (2013.01); *H01L 2224/83022* (2013.01);
(Continued)

(58) Field of Classification Search
CPC ............ H01L 2224/13111; H01L 2224/13155; H01L 2924/014; H01L 2924/15311; H01L 2224/05611; H01L 2224/05655; H01L 2224/29311; H01L 2224/29099; H01L 2924/01322; H01L 2924/01049; H01L 2924/0105
USPC ........ 257/766, 745, 673, 779, 783; 438/110, 438/104, 688; 205/150; 228/122.1
See application file for complete search history.

(56) References Cited

U.S. PATENT DOCUMENTS 2,995,475 A * 8/1961 Sharpless ................. 438/605
3,095,500 A * 6/1963 Jost ........................ 219/78.02
(Continued)

OTHER PUBLICATIONS

"Electrical Resistivity of Nickel-Indium Alloys between 10 and 800 K", Tzeng et al., phys. stat. sol. (a) 117, K47 (1990).*
(Continued)

*Primary Examiner* — Mohammed Shamsuzzaman
(74) *Attorney, Agent, or Firm* — Eric Brett Compton

(57) ABSTRACT

Provided among other things is an electrical device comprising: a first component that is a semiconductor or an electrical conductor; a second component that is an electrical conductor; and a strong, heat stable junction there between including an intermetallic bond formed of: substantially (a) indium (In), tin (Sn) or a mixture thereof, and (b) substantially nickel (Ni). The junction can have an electrical contact resistance that is small compared to the resistance of the electrical device.

20 Claims, 3 Drawing Sheets

(52) U.S. Cl.
CPC ............... *H01L 2224/83024* (2013.01); *H01L 2224/83075* (2013.01); *H01L 2224/83191* (2013.01); *H01L 2224/83192* (2013.01); *H01L 2224/83193* (2013.01); *H01L 2224/83203* (2013.01); *H01L 2224/83455* (2013.01); *H01L 2224/83825* (2013.01); *H01L 2924/01322* (2013.01); *H01L 2924/351* (2013.01); *Y10T 403/478* (2015.01)

(56) References Cited

U.S. PATENT DOCUMENTS

| | | | | |
|---|---|---|---|---|
| 3,540,988 | A | * | 11/1970 | Boles et al. .................. 205/150 |
| 3,678,569 | A | * | 7/1972 | Giesfeldt et al. ............. 438/104 |
| 4,796,082 | A | * | 1/1989 | Murakami et al. ........... 257/745 |
| 5,156,697 | A | * | 10/1992 | Bourell et al. ................ 264/497 |
| 5,234,153 | A | * | 8/1993 | Bacon et al. ............... 228/122.1 |
| 5,512,242 | A | * | 4/1996 | Tanaka et al. ................ 420/561 |
| 6,011,313 | A | * | 1/2000 | Shangguan et al. .......... 257/778 |
| 6,527,881 | B2 | * | 3/2003 | Kanematsu et al. .......... 148/525 |
| 6,602,354 | B2 | * | 8/2003 | Kanematsu et al. .......... 148/240 |
| 6,828,052 | B2 | * | 12/2004 | Zheng .......................... 429/495 |
| 2003/0066681 | A1 | * | 4/2003 | Uchida et al. ................ 174/260 |
| 2004/0191957 | A1 | * | 9/2004 | Chen et al. ................... 438/110 |
| 2008/0102307 | A1 | * | 5/2008 | Zidar | |

OTHER PUBLICATIONS

H. Okamoto, In—Ni (Indium-Nickel), Supplemental Literature Review: Section III, J. Phase Equilibria, vol. 24, No. 4, p. 379 (2003).

Nash P., and Nash A., Ni—Sn (Nickel-Tin), Binary Alloy Phase Diagrams, II Ed., Ed. T.B. Massalski, vol. 3, p. 2863-2864 (1990).

* cited by examiner

STRONG, HEAT STABLE JUNCTION

GOVERNMENT RIGHTS

This invention was made, at least in part, with U.S. government support under contract number W911NF-08-C-007. The U.S. government has certain rights in this invention.

FIELD

The present application relates generally to heat stable electrical junctions, such as the junctions between n-type or p-type materials, and intermetallic bonded interconnects.

BACKGROUND

There are several commercial approaches for joining components for stable working operation at high-temperature. One is "brazing" and another is thermocompression bonding. In the brazing approach, a mixture of metals at the eutectic composition is applied between the two members to be joined. The metals are aggressive chemically and the composition of the active components of an electrical element (e.g., the thermoelectric materials) can be significantly degraded by chemical interaction and interdiffusion with the braze. Also, the eutectic compound for the most common braze (aluminum-silicon eutectic) is only stable to about 660° C., which limits the useful temperature range available to many applications. Also, voids can form because of chemical interdiffusion between the components and the braze, and embrittled layers with poor mechanical properties can result. To successfully pursue this brazing approach, usually a more complicated, multi-layer solution composed of adhesion layers, diffusion barriers, and fluxes for the braze is utilized.

Thermocompression bonding uses thin gold layers applied to the two components to be joined. The two gold layers are placed in contact and heated to high-temperature to drive the mutual self-interdiffusion of the two gold layers into one monolithic gold layer. Gold does not oxidize at standard temperature, pressure and common lab environments, so thermocompression bonding can result in a low resistance electrical contact. However, gold is known to rapidly diffuse along all the surfaces and deeply into electrical components, such as thermoelectric materials. The deep diffusion of gold is known to poison thermoelectric materials and degrade thermoelectric device performance.

A method of forming low electrical resistance junctions that are strong and stable to elevated temperatures such as 800 to 900° C. may be useful.

SUMMARY

Provided among other things is an electrical device comprising: a first component that is a semiconductor or an electrical conductor; a second component that is an electrical conductor; and a strong, heat stable junction therebetween including an intermetallic bond formed of: substantially (a) indium (In), tin (Sn) or a mixture thereof, and (b) substantially nickel (Ni). The junction can have electrical contact resistance that is small compared to the resistance of the electrical device. The bond can comprise refractory intermetallic compounds between indium and/or tin and nickel including $In_3Ni_2$, $Sn_3Ni_2$ or $(In_xSn_{(1-x)})_3Ni_2$ intermetallic phases, for instance. And the bond may be formed of about 35 atomic percent to about 85 atomic indium, tin or the mixture thereof and/or about 15 atomic percent to about 65 atomic percent nickel. A strong bond obtains for the junction up to a temperature of about 750° C. or more. In certain embodiments, the junction has a resistivity of less than 15 microOhm-cm, or less than 1 microOhm-cm.

In certain embodiments, the device is a semiconductor device, wherein first component is a semiconductor, such as for example where the semiconductor device is an n-type or p-type semiconductor and may have greater functional stability than those formed by brazing and/or than those formed by gold thermocompression.

Further provided is a method of forming a junction between a first material that is a conductor or semiconductor to a second material that is a conductor or semiconductor, comprising: heating the prospective junction which comprises a layer of substantially indium, tin, or a mixture thereof aligned against a layer of substantially nickel to a temperature of about 400° C. or more, thereby forming a strong, heat stable intermetallic bond between the layers. During heating, a force sufficient to maintain alignment of the junction while the indium/tin and nickel react may be further applied.

In certain embodiments of the method, the junction is formed from the layer of substantially indium, tin or a mixture thereof aligned between the layer of substantially nickel and a second layer of substantially nickel. In certain embodiments, the bond is formed of about 35 atomic percent to about 85 atomic percent indium, tin or the mixture thereof; and/or 15 to 65 atomic percent nickel, or 30 to 50 atomic percent nickel. A strong bond obtains for the junction formed up to a temperature of about 750° C. or more. The junction formed has a resistivity of less than 15 microOhm-cm, or less than 1 microOhm-cm.

Further provided is a strong, heat stable junction including an intermetallic bond formed of: (a) substantially indium (In), tin (Sn) or a mixture thereof, and (b) substantially nickel (Ni).

The various parameters outlined for the junction in the context of an electrical device apply to the junction as claimed separate from the electrical device, such as useful content amounts, and the like.

DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only illustrative embodiments of this invention and are therefore not to be considered limiting of its scope, for the invention may admit to other equally effective embodiments.

To facilitate understanding, identical reference numerals have been used, where possible, to designate comparable elements that are common to the figures. The figures are not drawn to scale and may be simplified for clarity. It is contemplated that elements and features of one embodiment may be beneficially incorporated in other embodiments without further recitation.

DETAILED DESCRIPTION

The invention utilizes the observation that by appropriately coating on or providing on the surface or face of one of the elements to be joined a first material that is substantially nickel and coating on or providing on the first material or on the surface or face of the other element a second material that is substantially indium or tin or a mixture thereof, and appropriately treating the junction, one obtains a junction, believed to comprise $In_3Ni_2$, $Sn_3Ni_2$ and/or $(In_xSn_{(1-x)})_3Ni_2$ intermetallic phases that is strong and heat stable.

The mixture of indium and tin may be an alloy thereof characterized as x wt. % In:(1−x) wt. % Sn, where x is a weight percent value from 0 to 1. In certain embodiments, the mixture amount may initially be about 35 atomic percent to about 85 atomic percent (such as 50 to 70 percent) of the bond-forming materials.

While applicants believe that it is metallurgical compositions recited involved in forming the heat stable, strong junction, the invention relates to forming such a heat stable, strong junction, regardless of whether their scientific theory is correct. Other intermetallic compounds could be formed than the one enumerated herein, for example.

By "substantially nickel," it is meant that there is sufficient concentration thereof to provide, upon cross-migration with substantially indium, tin or a mixture thereof, a heat stable, strong $In_3Ni_2$, $Sn_3Ni_2$ and/or $(In_xSn_{(1-x)})_3Ni_2$ intermetallic phase(s). In certain embodiments, the amount of nickel in the intermetallic phase(s) may be about 15 atomic percent to about 65 atomic percent (such as about 30 to about 50 percent).

By "substantially indium, tin or a mixture thereof," it is meant that there is sufficient concentration thereof to provide, upon cross-migration with substantially nickel, a heat stable, strong $In_3Ni_2$, $Sn_3Ni_2$ and/or $(In_xSn_{(1-x)})_3Ni_2$ intermetallic phase(s).

"Heat stable" means that a strong bond obtains up for high temperatures, such as a temperature of about 700° C. or more. In certain embodiments, a strong bond obtains up to a temperature of about 750° C. or more, or about 800° C. or more.

A "strong" bond is one that maintains mechanical integrity of the device for its entire service life, such as a service life of 5 years. In certain embodiments of the invention, the junction has a strength consistent with a measure of strength for the junction formed by the method of Example 1 (see below, assuming the initial indium layer is 0.5 mm, and an alignment force of 25,000 $N/m^2$). The measure can be normalized to per junction area as appropriate. For example, the strength is within 40%, or within 20% of the reference junction of Example 1.

In certain embodiments, the indium, tin or mixture thereof and nickel may be provided as discrete adjacent layers to form the heat stable, strong junction upon bonding thereof.

Figure 1A:
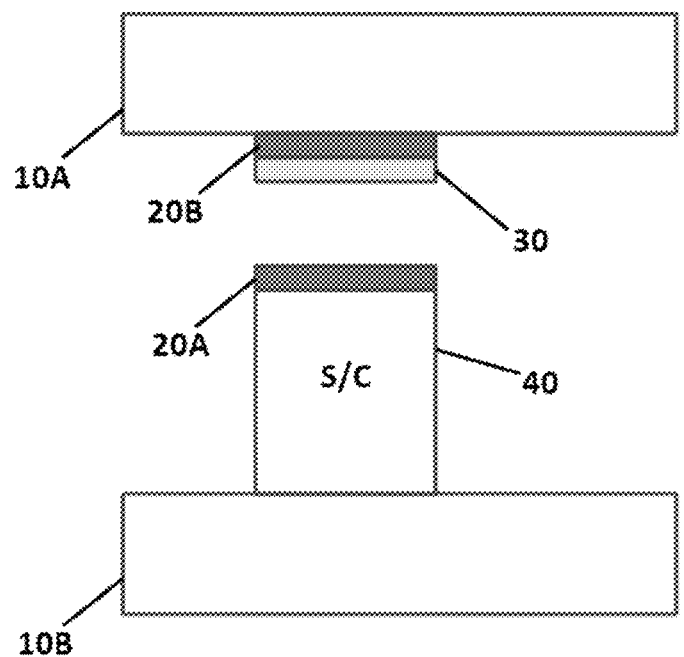
FIGS. 1A and 1B depict two shoes (conductors 10A and 10B) with a semiconductor 40, just prior to formation of a junction of the invention.

In FIG. 1A schematically shows an incipient electrical junction prior to its fusion. Conductor (which can be termed a "shoe") 10A can be formed of nickel. If formed of nickel, then nickel layer 20B can be omitted. Formed on conductor 10A or nickel layer 20B is indium layer 30. The semiconductor 40 has formed on it nickel layer 20A. The semiconductor 40 is illustrated as electrically joined with conductor 10B.

Figure 1B:
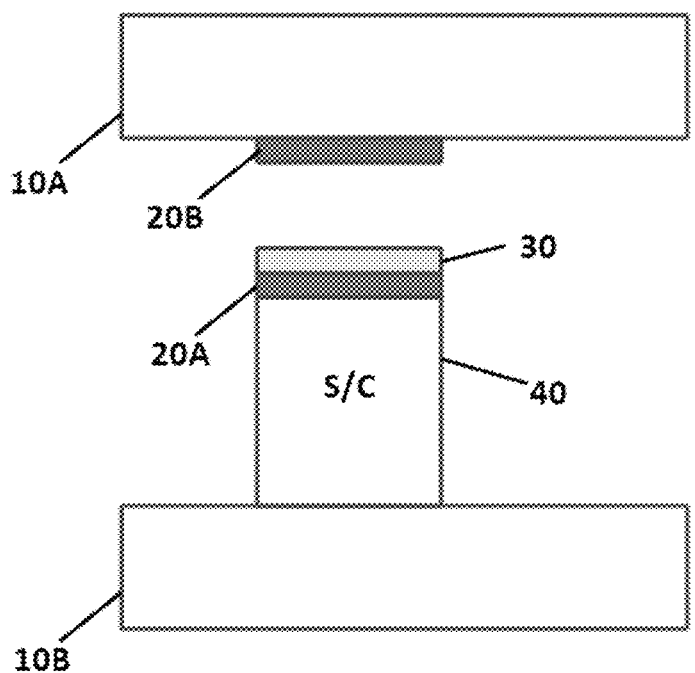

In FIG. 1B the indium layer is formed on nickel layer 20A. Methods of forming the metal layers include for example electroplating, electro-less plating, vapor-deposition, sputtering, and the like.

While the above referenced illustrations show the second material (i.e., the indium, tin or a mixture thereof) sandwiched between layers of the first material, the invention can be obtained with a layer of the first nickel material, and a layer of the second material, whether indium or tin or a mixture thereof.

In forming the junction, force is usefully applied to maintain the alignment of the components while the indium and/or tin reacts with the nickel. For example, 25,000 $N/m^2$ can be used. Surfaces are usefully cleaned with flux prior to application of metal layers, and prior to reacting to form the heat stable, strong junction. Heat is applied, which can usefully be done under vacuum or overpressure of inert gas atmosphere so as to prevent chemical reaction with atmospheric oxidizers ($O_2$, water vapor, etc.).

Without being bound by theory, in the indium:nickel systems, it is believed that a temperature of about 156.6° C. induces a first reaction, characterized by forming an intermetallic compound with an indium:nickel stoichiometric ratio of approximately 7:3, i.e., $In_7Ni_3$. Prior to this transition the components can be dis-assembled, re-positioned, and reassembled repeatedly, as desired, because negligible metallurgical reaction occurs. After this first transition, re-positioning is more difficult. When the temperature is brought to a range of about 400° C. or higher, such as about 404° C. to about 420° C., a second transition occurs to the strength and stability of the invention. It is believed that the product of this transition is characterized by forming an intermetallic compound with an indium:nickel stoichiometric ratio of approximately 3:2, i.e., $In_3Ni_2$. Information of indium:nickel phase equilibria can be found in H. Okamoto, *J. Phase Equilibria*, Vol. 24, No. 4, p. 379 (2003) (incorporated by reference herein, along with the entirety of the article in which the chart of p. 379 is found).

For nickel:tin systems, it is believed that a temperature of about 231° C. induces a first reaction, characterized by forming an intermetallic compound with an nickel:tin stoichiometric ratio of approximately 3:4, i.e., $Ni_3Sn4$. Similar to indium:nickel systems, prior to this transition the components can be dis-assembled, re-positioned, and reassembled repeatedly, as desired, because negligible metallurgical reaction occurs. After this first transition, re-positioning is more difficult. When the temperature is brought to a range of about 795° C. or higher, such as about 911° C. to about 948° C., a second transition occurs to the strength and stability of the invention. It is believed that the product of this transition is characterized by forming an intermetallic compound with nickel:tin stoichiometric ratio of approximately 3:2, i.e., $Ni_3Sn_2$. Information of nickel:tin phase equilibria can be found in Nash P., and Nash A., Ni—Sn (Nickel-Tin), Binary Alloy Phase Diagrams, II Ed., Ed. T. B. Massalski, Vol. 3, p 2863-2864 (1990) (incorporated by reference herein).

For mixtures of tin and indium, it is expected that the temperature range will be approximately an interpolation of the above ranges adjusted to the atomic ratio of tin to indium. The temperature used in production can usefully be higher, such as about 400° C. to about 900° C., or higher still if high amounts of tin are used.

In certain embodiments, the indium:nickel or tin:nickel ratio of the junction may extend from about 3.5:1 to about 3:2, or about 3:1 to about 3:2.

It is believed that there are several key characteristics of the junction that enable the success of this approach including: 1.) Thermal stability, since for example the $In_3Ni_2$ compound is stable up to 869° C. 2.) Mechanical strength, since lab experience with a test sample and a thermoelectric prototype indicates the junction is unusually strong and robust. 3.) Thermal-match, since that the thermal expansion coefficient of a nickel shoe and the thermoelectric materials is very closely matched across the spanned temperature range, resulting in dramatically reduced thermal stress and resistance to breakage. 4.) Low electrical resistance, meaning that electrical current is not significantly impeded at the junction between for example the shoe and, say, the thermoelectric materials.

One metric for characterizing the mechanical strength of the indium:nickel or tin:nickel junctions can be obtained for fully assembled devices which have physically broken. It has been observed that prototype devices of the invention that have broken do not break at the junctions described herein. Instead, mechanical failure is observed within the e.g. semiconductor component itself, and the indium:nickel or tin:nickel bonds remain mechanically intact. Based on this observation, the lower limit of the bond strength can be estimated and indexed as the fracture toughness of the semiconductor used for the prototype devices (lead telluride, PbTe) which has a fracture toughness of approximately 0.35 $(MegaPascals)(meters)^{1/2}$. Thus, in certain embodiments, the junction of the invention has a fracture toughness of greater than approximately 0.35 $(MegaPascals)(meters)^{1/2}$.

Utilizing the invention, strong, heat stable junctions can be formed with resistivities of less than 13 microOhm-cm based on the experiment where a pure nickel block was joined with another pure nickel block and using the electrical resistivity across the interface and the area of the interface, an estimate of the electrical contact resistivity at the interface appeared to be less than 1 microOhm-cm.

Utilizing the invention, it is believed that semiconductors with adjacent heat stable, strong junctions of the invention have greater functional stability than those formed by brazing (absent diffusion barriers) or by gold thermocompression, such as functional stability over a 6 month, 1 year or 2 year period. The semiconductor and junction are thus refractory to this type of degradation.

Utilizing the invention, it is believed that heat stable, strong junctions can be formed that have greater relative retention of physical strength over time than formed by brazing, such as strength retention over a 6 month, 1 year or 2 year or 5 year period. The junction is thus refractory to this type of degradation.

One field of use for the invention is in thermoelectric power generators, such as are proposed to be used to recover energy from the otherwise wasted heat of an internal combustion engine. One location for use is in the exhaust train. For example, such energy recovery can reduce or eliminate the need to increase engine load by having it drive an alternator. Such thermoelectric power generators are used in deep space probes, with the heat obtained from nuclear decay. The invention provides the stability for the component n-type or p-type semiconductors needed for reliability over the lifetime of, for example, a car.

The strong stable junctions described herein can be used in additional electrical devices needing such junctions. For example, solar cell devices, such as those where solar light is concentrated as much as 400 times, with resulting dramatic increases in temperature. The temperature of the solar cell may reach several hundred degrees Celsius above ambient temperature. For this and like applications, this electrical contact technology would offer a path to increased lifetime without degradation in performance.

Specific embodiments according to the methods of the present invention will now be described in the following examples. The examples are illustrative only, and are not intended to limit the remainder of the disclosure in any way.

Example 1

Figure 2:
FIG. 2 is a composite optical micrograph showing a metal-to-metal junction according to the invention.
Figure 3:
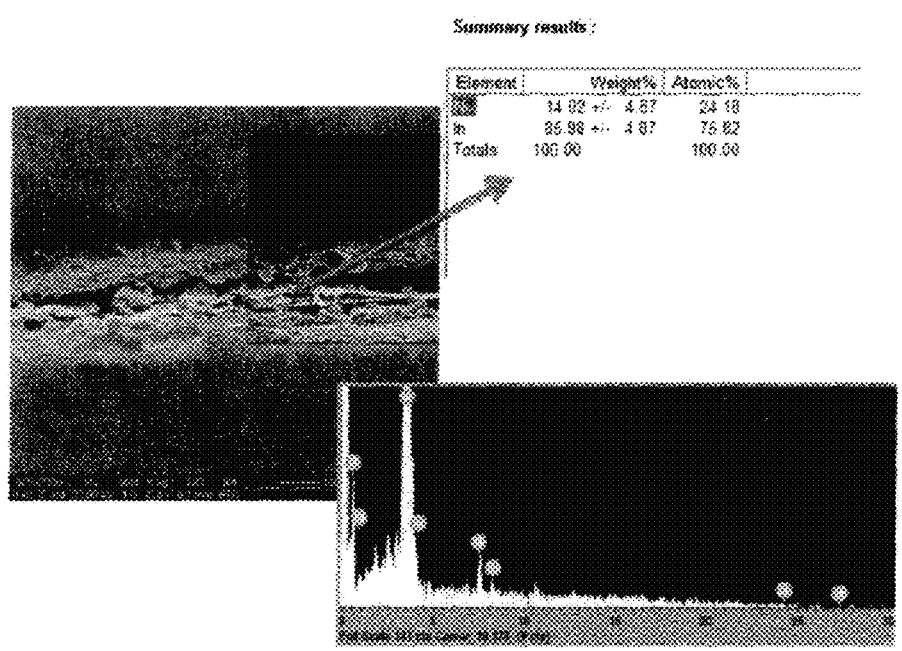
FIG. 3 is a scanning electron micrograph (SEM) and an inset of energy-dispersive x-ray (EDX) data.

To determine the properties of the intermetallic layer (junction), a test sample was fabricated that consisted of two small cubes of pure nickel metal that were joined together with a thin layer of indium metal and heated to 540° C. As shown in FIG. 2, the nickel and indium reacted and formed a stable intermetallic compound, with the indium metal appearing to be consumed completely (i.e., substantially no pure indium remaining). The intermetallic layer was also examined using energy-dispersive x-ray (EDX) analysis to determine its chemical stoichiometry. As shown in FIG. 3, the intermetallic layer (junction) that has formed is a compound that has a stoichiometry corresponding to roughly a 3:1 indium:nickel ratio. With continued time spent at high-temperature, given a sufficient reservoir of nickel, it is believed that solid-state interdiffusion will continue and the composition will trend toward thermal equilibrium and a $In_3Ni_2$ stoichiometry.

Of course, the high-temperature intermetallic bonding layer is of no use if it is electrically insulating. Thus, a measurement of the electrical resistance of the contact was made. The resistance was determined using a four-point-probe measurement, meaning that the electrical current and voltage probes are physically different. This technique is especially useful because the resistivity of the two nickel cubes can be determined in the experiment and compared to reference values for pure nickel. The position of the intermetallic layer is indicated by the dashed line on FIG. 4.

Figure 4:
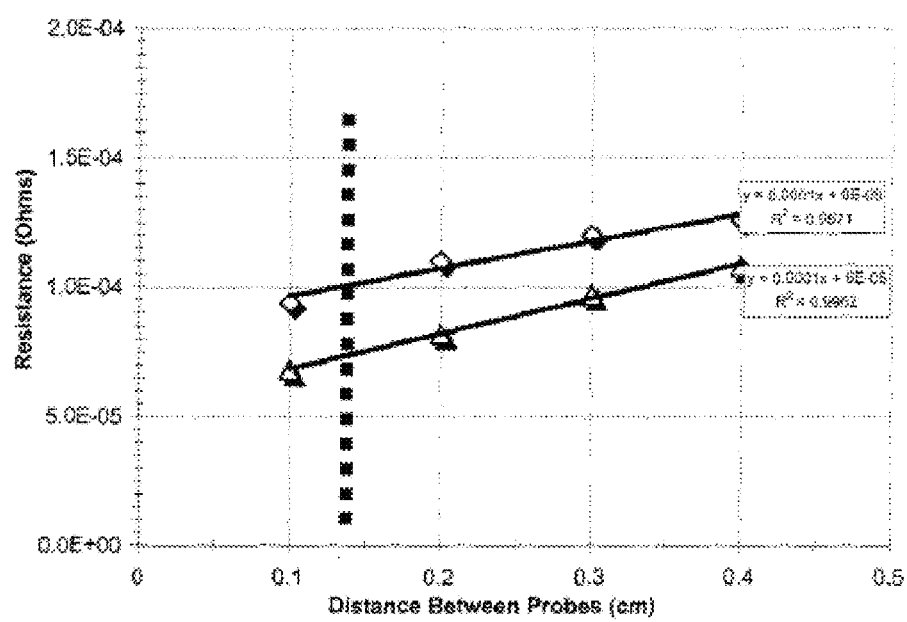
FIG. 4 shows resistance data for a junction of the invention.

Using the data of FIG. 4, and the physical geometry of the nickel cubes, an electrical resistivity value of 12 microOhm-cm was determined. This compares very well with the reference value of 6.93 microOhm-cm, and is direct evidence of remarkably low contact resistance of the indium-nickel intermetallic.

All ranges recited herein include ranges therebetween, and can be inclusive or exclusive of the endpoints. Optional included ranges are from integer values therebetween (or inclusive of one original endpoint), at the order of magnitude recited or the next smaller order of magnitude. For example, if the lower range value is 0.2, optional included endpoints can be 0.3, 0.4, . . . 1.1, 1.2, and the like, as well as 1, 2, 3 and the like; if the higher range is 8, optional included endpoints can be 7, 6, and the like, as well as 7.9, 7.8, and the like. One-sided boundaries, such as 3 or more, similarly include consistent boundaries (or ranges) starting at integer values at the recited order of magnitude or one lower. For example, 3 or more includes 4 or more, or 3.1 or more.

This invention described herein is of an electrical junction, and methods of forming the same. Although some embodiments have been discussed above, other implementations and applications are also within the scope of the following claims. Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the following claims.

Publications and references, including but not limited to patents and patent applications, cited in this specification are herein incorporated by reference in their entirety in the entire portion cited as if each individual publication or reference were specifically and individually indicated to be incorporated by reference herein as being fully set forth. Any patent application to which this application claims priority is also incorporated by reference herein in the manner described above for publications and references.

LISTING OF NUMBERED ELEMENTS IN DRAWINGS

Conductor (which can be termed a "shoe") 10A
conductor 10B
nickel layer 20A
nickel layer 20B
Indium layer 30
semiconductor 40

What is claimed is:

1. An electrical device comprising:
   a first component that is a semiconductor or an electrical conductor comprising a layer comprising tin (Sn);
   a second component that is an electrical conductor comprising a layer comprising nickel (Ni); and
   a conductive strong, heat stable bond formed between the (a) the layer comprising tin (Sn), and (b) the layer comprising nickel (Ni), the bond comprising $Ni_3Sn_2$,
   wherein a transition occurs to the strength and stability of the bond when the first and second components are heated to a range of about 795° C. or higher causing cross-migration of the tin and nickel at the interface of the respective layers of the first and second components forming the $Ni_3Sn_2$.

2. The electrical device of claim 1, wherein the bond further comprises $Sn_3Ni_2$.

3. The electrical device of claim 1, wherein the bond is formed of about 35 atomic percent to about 85 atomic percent tin.

4. The electrical device of claim 1, wherein the bond is formed of about 15 atomic percent to about 65 atomic percent nickel.

5. The electrical device of claim 1, wherein the bond is thermally and mechanically stable at least up to a temperature of about 750° C.

6. The electrical device of claim 1, wherein the bond has a resistivity of less than 15 microOhm-cm.

7. The electrical device of claim 1, wherein the bond has a resistivity of less than 1 microOhm-cm.

8. The electrical device of claim 1, wherein the first component is a semiconductor.

9. The electrical device of claim 8, wherein the semiconductor is an n-type or p-type semiconductor.

10. The electrical device of claim 1, wherein the bond does not comprise indium.

11. A method of forming an electrical device comprising:
    a first component that is a semiconductor or an electrical conductor comprising a layer comprising tin (Sn);
    a second component that is an electrical conductor comprising a layer comprising nickel (Ni); and
    a conductive strong, heat stable bond formed between the (a) the layer comprising tin (Sn), and (b) the layer comprising nickel (Ni), the bond comprising $Ni_3Sn_2$,
    the method comprising:
    heating the first component and the second component to a temperature of about 795° C. or higher, thereby forming the conductive strong, heat stable bond formed between the (a) the layer comprising tin (Sn), and (b) the layer comprising nickel (Ni) comprising the $Ni_3Sn_2$,
    wherein a transition occurs to the strength and stability of the bond when the first and second components are heated to said temperature range causing cross-migration of the tin and nickel at the interface of the respective layers of the first and second components forming the $Ni_3Sn_2$.

12. The method of claim 11, wherein the bond is formed from the layer comprising tin of the first component aligned between the layer comprising nickel of the second component and another layer of nickel.

13. The method of claim 11, wherein the layer comprising tin (Sn) of the first component comprises a mixture of tin (Sn) and indium (In).

14. The method of claim 11, wherein the bond is formed of about 35 atomic percent to about 85 atomic percent tin.

15. The method of claim 11, wherein the bond is formed of about 15 atomic percent to about 65 atomic percent nickel.

16. The method claim 11, further comprising:
    applying a force sufficient to maintain alignment of the first component and the second component while the tin and nickel react during said heating.

17. The method of claim 11, wherein the bond formed has a resistivity of less than 15 microOhm-cm.

18. The electrical device of claim 1, wherein the layer comprising tin (Sn) comprises a mixture of tin (Sn) and indium (In), and the bond further comprises $(In_xSn_{(1-x)})_3Ni_2$ where $0>x>1$, where x is wt. %.

19. The method of claim 13, wherein the mixture of indium and tin in the layer of tin of first component is characterized as x wt. % In: (1−x) wt. % Sn, where $0>x>1$.

20. The method of claim 11, wherein the first component and the second component are heated to a temperature between about 911° C. and about 948° C.

* * * * *